United States Patent [19]

Jackson et al.

[11] Patent Number: 4,757,369
[45] Date of Patent: Jul. 12, 1988

[54] GROUP III-V SEMICONDUCTOR ELECTRICAL CONTACT

[75] Inventors: Thomas N. Jackson, Peekskill; Peter D. Kirchner, Garrison; George D. Pettit, Mahopac; Richard F. Rutz, Cold Spring; Jerry M. Woodall, Bedford Hills, all of N.Y.

[73] Assignee: International Business Machines Corporation, Armonk, N.Y.

[21] Appl. No.: 60,700

[22] Filed: Jun. 10, 1987

Related U.S. Application Data

[63] Continuation of Ser. No. 726,205, Apr. 23, 1985, abandoned.

[51] Int. Cl.$^4$ .................. H01L 29/167; H01L 23/48; H01L 29/161; H01L 29/62
[52] U.S. Cl. ........................................ 357/63; 357/65; 357/16; 357/67
[58] Field of Search ................. 357/63, 65, 16, 67

[56] References Cited

U.S. PATENT DOCUMENTS

| | | | |
|---|---|---|---|
| 4,035,205 | 7/1977 | Lebailly et al. | 148/171 |
| 4,316,201 | 2/1982 | Christou et al. | 357/15 |
| 4,583,110 | 4/1986 | Jackson et al. | 357/65 |
| 4,615,766 | 10/1986 | Jackson et al. | 437/17 |

OTHER PUBLICATIONS

IBM Technical Disclosure Bulletin, vol. 26, No. 10B, Mar. 1984, p. 5396, "Silicide Ohmic Contact to p-Type GaAs" by Jackson et al.
IBM Technical Disclosure Bulletin, vol. 25, No. 3A, Aug. 1982, p. 1195, "GaAs Ohmic Contact" by Heiblum et al.
Solid State Electronics, Pergamon Press, 1965, vol. 8, pp. 943-946, "The Diffusion of Silicon in Gallium Arsenide" by G. R. Antell.
IBM Technical Disclosure Bulletin, vol. 13, No. 7, Dec. 1970, p. 1876, "Deposition of Germanium on a Germanium or Gallium Arsenide Substrate" by Berkenblit et al.
Electronics Letters, vol. 15, No. 24, Nov. 22, 1979, p. 800, by Stall et al.
J. Appl. Phys. 49(5), May 1978, p. 2998, "Smooth and Continuous Ohmic Contacts to GaAs Using Epitaxial Ge Films" by Anderson, Jr. et al.

Primary Examiner—Andrew J. James
Assistant Examiner—Robert P. Limanek
Attorney, Agent, or Firm—Alvin J. Riddles

[57] ABSTRACT

A layer of an amphoteric dopant on the surface of a group III-V intermetallic semiconductor crystal will diffuse into the crystal surface in a heating cycle forming a stable contact. The contact can be ohmic or rectifying depending on the localized presence of an excess of one crystal ingredient. A layer of Si on GaAs upon heating forms a rectifying contact. When the layer of Si contains As, the contact is ohmic.

5 Claims, 1 Drawing Sheet

GROUP III-V SEMICONDUCTOR ELECTRICAL CONTACT

This application is a continuation of application Ser. No. 06/726,205 filed Apr. 23, 1985 now abandoned.

DESCRIPTION

1. Technical Field

The technical field of the invention is that of electrical contacts to group III-V intermetallic crystal semiconductor devices. At the present state of the art, the group III-V intermetallic semiconductor crystal materials, of which the material gallium arsenide (GaAs) is receiving the most attention, have a number of advantages, however, there is a major impediment to the practice of technology involving these semiconductor materials in that a barrier to current flow is inherent when an external electrode is applied to the surface.

2. Background Art

In the practice of this technology, especially in instances where broad area integrated circuits are placed with very close spacing, alloying operations, ion implantation operations with subsequent annealing, and diffusion operations all temperature based operate to change the crystal to metal interface characteristics so that many electrical contact structures have thermal stability only over narrow temperature ranges and reproducibility requires constraints on the entire fabrication process.

One effort in the art, described in U.S. Pat. No. 4,583,110, provides a metal electrical ohmic contact to a III-V intermetallic crystal through the use of an amphoteric dopant that is caused to occupy donor sublattice crystal sites in the region adjacent to the surface on which the metal contact is to be applied as the crystal is grown. The control of the interface achieved provides temperature stability and reproducibility.

DISCLOSURE OF THE INVENTION

It has been found that a semiconductor device substrate of a group III-V intermetallic compound crystal with a layer of an amphoteric dopant on the device receiving surface will provide an intermediate manufacturing product in the fabrication of semiconductor integrated circuits that has the advantages of both ohmic and rectifying contacts of high temperature stability and reproducibility.

The amphoteric dopant layer on the device surface of the group III-V intermetallic semiconductor crystal where external electrical metal contacts are to be placed provides a temperature stable, reproducible rectifying barrier by pinning the Fermi level at the surface.

A dopant is defined as amphoteric when it can impart either n or p type conductivity.

The amphoteric dopant layer on the device surface of the group III-V intermetallic semiconductor crystal, where external electrical metal contacts are to be placed, provides an ohmic contact to the crystal in the localized presence of the group V element of the crystal in the amphoteric dopant layer.

In accordance with the invention, atoms of amphoteric dopant from the amphoteric dopant layer in the presence of an excess of atoms of a particular sublattice of the group III-V crystal in a temperature cycle will enter the region of the crystal adjacent the surface to reside on the opposite sublattice site. This operates to reduce the width of the depletion region at the metal-crystal interface to a width that will permit quantum mechanical tunneling providing thereby an ohmic contact. As an example, in the presence of an excess of group V atoms in an amphoteric dopant layer on a group III-V crystal, the amphoteric dopant will enter the surface of the crystal and reside primarily on donor sublattice sites, thereby reducing the surface depletion width.

In accordance with the invention, the ability to provide either ohmic or rectifying contacts through providing a selected localized pattern of the group V element in the amphoteric dopant layer for the ohmic contacts permits later personalization decisions in the fabrication of integrated circuit arrays. While the contacts of the invention have improved temperature stability, the personalization advantage permits fabrication with reduced subsequent processing.

In order to facilitate communication of the concepts involved in the principles of the invention, the description will be focused on the preferred III-V compound GaAs n-type crystal using the preferred amphoteric dopant Si although in the light of the principles set forth various substitutions will be readily apparent to one skilled in the art.

Figure 1:
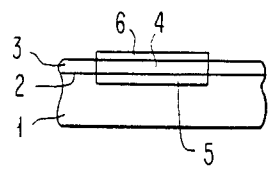
FIG. 1 is a portion of an integrated circuit wherein the invention provides different type contacts.

Referring to FIG. 1, a schematic view of a portion of an integrated circuit is provided where two types of external electrical contacts in an intermediate manufacturing product is illustrated. In FIG. 1, a III-V intermetallic semiconductor monocrystalline body 1 of GaAs serves as the device portion. The body 1 has a surface 2 in which devices are fabricated and electrical contacts are positioned. A layer of an amphoteric dopant of silicon 3 is positioned on the surface 2.

A localized quantity 4 of the group V crystal element As is added to the Si layer 3. The As quantity 4 permits the Si from layer 3 when diffusing into the crystal 1 through the surface 2 to form a region 5 of Si atoms on donor Ga sublattice sites which reduce the depletion width of the barrier at the surface 2 permitting a tunneling ohmic contact. A metal external electrical connection 6 is placed over the region 4.

Figure 2:
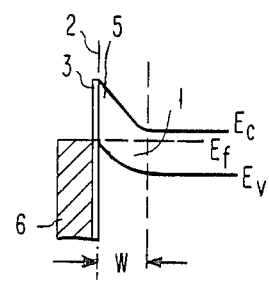
FIG. 2 is a generalized band energy diagram of the contact of FIG. 1 for the gallium arsenide and metal portions of the contact.

Referring to FIG. 2, a band energy diagram is provided that illustrates the conditions that result in both ohmic and rectifying contact performance. Like reference numerals with FIG. 1 are provided for explanation clarity. At the silicon 3, crystal 1, interface 2, the silicon 3 upon heating in the presence of the localized group V element As diffuses into GaAs crystal 1 onto the donor or Ga sublattice sites in the region 5 and effectively reduces the depletion width labelled W to a value approximately below 100 Angstroms that permits quantum mechanical tunneling and hence ohmic contact performance.

Figure 3:
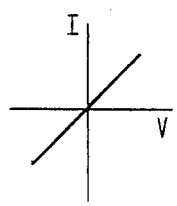
FIG. 3 is the current voltage characteristic of the ohmic contact.

The electrical performance of the ohmic contact is illustrated in FIG. 3. The performance and advantages can be readily seen in connection with both FIGS. 2 and 3 wherein in FIG. 2 the depletion width W permits the tunnelling through any barrier so that current flow is linear in both directions as shown in the current-voltage characteristic curve of FIG. 3.

Figure 4:
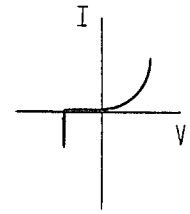
FIG. 4 is the current voltage characteristic of the rectifying contact.

Referring again to FIG. 2, the conditions that result in rectifying contact performance will be described. In the absence of the localized group V element, the silicon layer 3 between the metal 6 and the crystal surface 2 upon heating diffuses slightly into the surface 2 on both donor and acceptor sublattices so that its net doping effect is insufficient to produce dominant tunneling performance and the electrical performance is rectifying as illustrated in FIG. 4.

The preferred amphoteric dopant layer for contact to GaAs is silicon since the contacts will be stable to 1000° C. While germanium is usable under some conditions, the germanium-gallium arsenide eutectic temperature of 680° C. is too low to accommodate some processing temperatures that may reach 900° C.

BEST MODE FOR CARRYING OUT THE INVENTION

Referring to FIG. 1, the invention is best practiced using a n-doped GaAs crystal layer for the body 1, using Si for the amphoteric dopant layer 3 and As for the crystal atom ingredient. The technique of molecular beam epitaxy is employed for fabrication. In molecular beam epitaxy, the various ingredients are delivered to the epitaxial growth site in the form of a beam of atomic particles. The gallium arsenide crystal 1 is grown as far as the interface 2 with the silicon 3. The silicon layer 3 is then grown on the interface 2 in a thickness from a minimum of a fraction of a monolayer to several hundred angstroms with a preferred thickness of some 20 nanometers. The arsenic 4 is ion implanted into the silicon in selected areas where ohmic performance is desired. A temperature cycle of 600° to 1000° C. for a few seconds to a few minutes is then provided.

What has been described is the provision of a contact material with a patterned additive so that contacts that are either rectifying or ohmic in performance can be provided.

Having thus described our invention, what we claim as new and desire to secure by Letters Patent is:

1. A semiconductor intermediate manufacturing product comprising in combination:
    a GaAs semiconductor body having at least one surface region in which an array of semiconductor devices each in a specific area thereof are positioned,
    a layer of Si in contact with each said specific area in said surface region,
    a localized atom concentration of at least one of As and Ga occupying an area less than said specific area in said surface region, and
    a metal member covering said specific area.
2. The product of claim 1 wherein said layer is 20 nanometers thick.
3. A semiconductor intermediate manufacturing product comprising in combination:
    a monocrystalline group III-V intermetallic semiconductor body of a particular extrinsic conductivity type having at least one surface region in which in a specific area thereof a semiconductor device is positioned,
    a layer of Si in contact with said specific area in said surface region, and
    a localized atom concentration of at least one of a Group III and a Group V element occupying an area less than said specific area in said surface region, and
    a metal member covering said specific area.
4. The product of claim 3 wherein said atoms in said localized concentration is As.
5. The product of claim 4 wherein said layer is 20 nanometers thick.

* * * * *